(12) United States Patent
Ogawa et al.

(10) Patent No.: US 11,367,831 B2
(45) Date of Patent: *Jun. 21, 2022

(54) SEMICONDUCTOR DEVICE

(71) Applicant: ABLIC Inc., Chiba (JP)

(72) Inventors: Yohei Ogawa, Chiba (JP); Hirotaka Uemura, Chiba (JP)

(73) Assignee: ABLIC INC., Chiba (JP)

( * ) Notice: Subject to any disclaimer, the term of this patent is extended or adjusted under 35 U.S.C. 154(b) by 199 days.

This patent is subject to a terminal disclaimer.

(21) Appl. No.: 16/803,016

(22) Filed: Feb. 27, 2020

(65) Prior Publication Data

US 2020/0313080 A1  Oct. 1, 2020

(30) Foreign Application Priority Data

Mar. 28, 2019 (JP) .............................. JP2019-064068
Nov. 28, 2019 (JP) .............................. JP2019-215697

(51) Int. Cl.
*H01L 43/06* (2006.01)
*G01R 33/07* (2006.01)
*H01L 43/04* (2006.01)

(52) U.S. Cl.
CPC .......... *H01L 43/065* (2013.01); *G01R 33/077* (2013.01); *H01L 43/04* (2013.01)

(58) Field of Classification Search
CPC ..... H01L 43/065; H01L 43/04; G01R 33/077; G01R 33/0017
See application file for complete search history.

(56) References Cited

U.S. PATENT DOCUMENTS 9,116,192 B2    8/2015  Stahl-Offergeld et al.
11,099,244 B2*  8/2021  Hioka ................ G01R 33/0035
(Continued)

FOREIGN PATENT DOCUMENTS

DE   10108640 A1   9/2002
EP   3591416 A1   1/2020

OTHER PUBLICATIONS

Extended European Search Report in Europe Application No. 20164004.2, dated Aug. 6, 2020, 10 pages.

*Primary Examiner* — Jose R Diaz
(74) *Attorney, Agent, or Firm* — Crowell & Moring LLP

(57) ABSTRACT

A semiconductor device includes a semiconductor substrate having a surface perpendicular to the first direction; a vertical Hall element formed in the semiconductor substrate, and including a magnetosensitive portion having a depth in the first direction, a width in the second direction, and a length in the third direction; and an excitation wiring extending in the third direction and disposed above the semiconductor substrate and at a position that overlaps the center position of the width of the magnetosensitive portion, and the value u derived from Expression (1) is 0.6 or more:

$$u = \frac{\tan^{-1}\left(\frac{W+W_c}{2h}\right) - \tan^{-1}\left(\frac{W-W_c}{2h}\right)}{2\tan^{-1}\left(\frac{W_c}{2h}\right)} \quad (1)$$

where W is the width of the magnetosensitive portion, Wc/2 is a distance from the center position of the width of the magnetosensitive portion to the first end surface closer (Continued)

thereto, and h is a distance from the center position of the depth of the magnetosensitive portion to the excitation wiring.

4 Claims, 8 Drawing Sheets

(56) References Cited

U.S. PATENT DOCUMENTS

| | | |
|---|---|---|
| 2012/0016614 A1 | 1/2012 | Hohe et al. |
| 2013/0057256 A1* | 3/2013 | Ernst .................. G01R 33/0005 324/202 |
| 2013/0138372 A1 | 5/2013 | Ausserlechner |
| 2017/0261565 A1 | 9/2017 | Ausserlechner |

* cited by examiner

SEMICONDUCTOR DEVICE

RELATED APPLICATIONS

This application claims priority to Japanese Patent Application Nos. 2019-064068 filed on Mar. 28, 2019, and 2019-215697 filed on Nov. 28, 2019, the entire contents of which are incorporated herein by reference.

BACKGROUND OF THE INVENTION

1. Field of the Invention

The present invention relates to a semiconductor device.

2. Description of the Related Art

There has been known a semiconductor device using a Hall element, for example, as a magnetic sensor. The Hall elements have been used in various applications as magnetic sensors capable of detecting a position or an angle in a non-contact manner. The Hall elements include a vertical Hall element and a horizontal Hall element. Of those, the horizontal Hall element is a magnetic sensor which detects a magnetic field component perpendicular to an element surface, while the vertical Hall element is a magnetic sensor which detects a magnetic field component parallel to the element surface. Further, there has been proposed a magnetic sensor in which the horizontal Hall element and the vertical Hall element are combined to two-dimensionally or three-dimensionally detect a magnetic field.

The above-mentioned vertical Hall element is, however, affected more easily by manufacturing variation than the horizontal Hall element, and is more liable to exhibit large variation in sensitivity and offset voltage characteristic than the horizontal Hall element.

The following method has been proposed to calibrate such characteristic variation. In the method an excitation wiring is disposed near the vertical Hall element, and a magnetic field of a predetermined intensity (hereinafter referred to as "calibration magnetic field") is generated by the constant current flowing through the excitation wiring so as to apply to a magnetosensitive portion of the vertical Hall element, and estimate the sensitivity of the magnetosensitive portion (see, for example, U.S. Pat. No. 9,116,192). Specifically, the invention described in U.S. Pat. No. 9,116,192 is directed to the estimation of an actual sensitivity of the magnetosensitive portion by changing the intensity of the calibration magnetic field and measuring a change in Hall voltage generated from the vertical Hall element.

Further, according to the invention described in U.S. Pat. No. 9,116,192, the center position of the excitation wiring is laterally offset from the center position of the magnetosensitive portion in the vertical Hall element, that is, the center position of the excitation wiring and the center position of the magnetosensitive portion are laterally spaced apart from each other.

This arrangement reduces variation in intensity of the calibration magnetic field generated by the excitation wiring due to variation in, for example, the width of the excitation wiring caused by process fluctuation in manufacturing a semiconductor device.

However, in the invention described in U.S. Pat. No. 9,116,192, the excitation wiring and the magnetosensitive portion are laterally spaced apart from each other. That is, since an intensity of a calibration magnetic field generated by the current flowing through the excitation wiring is inversely proportional to a distance from the excitation wiring, the longer the distance between the magnetosensitive portion and the excitation wiring becomes, the lower the intensity of the calibration magnetic field applied to the magnetosensitive portion becomes.

As the intensity of the calibration magnetic field applied to the magnetosensitive portion becomes lowered, a change in Hall voltage generated from the vertical Hall element becomes smaller. Thus, with the invention described in U.S. Pat. No. 9,116,192, even though the variation in intensity of the calibration magnetic field applied to the magnetosensitive portion can be reduced, accuracy of estimating the actual sensitivity of the magnetosensitive portion lowers since the intensity of the calibration magnetic field becomes low.

The amount of current flowing through the excitation wiring can be increased, to thereby increase the intensity of the calibration magnetic field applied to the magnetosensitive portion. However, as the amount of current flowing through the excitation wiring becomes larger, the amount of heat generated by the excitation wiring becomes larger.

Further, with the invention described in U.S. Pat. No. 9,116,192, since the center position of the excitation wiring is laterally offset from the center position of the magnetosensitive portion by a large amount, peripheral circuits disposed around the magnetosensitive portion are close to the excitation wiring. In this case, the peripheral circuits are affected by the heat from the closely located excitation wiring. Specifically, since the heat generation in the excitation wiring causes asymmetric temperature distribution in each peripheral circuit, characteristics of each peripheral circuit fluctuate. Accordingly, the increase in the amount of current flowing through the excitation wiring similarly leads to the lowered accuracy in the estimation of the actual sensitivity of the magnetosensitive portion.

By increasing a distance between the excitation wiring and each peripheral circuit, the fluctuation of characteristics of each peripheral circuit can be suppressed. However, this is not a practical solution because an increase in an area required for the semiconductor device leads to an increase in cost.

SUMMARY OF THE INVENTION

It is an object of the present invention to provide a semiconductor device that enhances a generation efficiency of a calibration magnetic field applied to a magnetosensitive portion, and suppresses intensity variation of the calibration magnetic field and fluctuation of characteristics of each peripheral circuit caused by heat.

In order to achieve the above-mentioned object, according to at least one embodiment of the present invention, a semiconductor device includes a semiconductor substrate having a surface perpendicular to a first direction; a vertical Hall element formed in the semiconductor substrate, and including a magnetosensitive portion having a depth in the first direction, a width in a second direction perpendicular to the first direction, and a length in a third direction perpendicular to both of the first direction and the second direction; and an excitation wiring having a first end surface and a second end surface in the second direction, and extending in the third direction. In the semiconductor device, the excitation wiring is disposed on a surface side of the semiconductor substrate and at a position that is apart from the magnetosensitive portion, and overlaps a center position of the width of the magnetosensitive portion as viewed in plan view from the first direction. At the position at which the excitation wiring is disposed, a distance from the center position of the width of the magnetosensitive portion to the first end surface is equal to or smaller than a distance from the center position of the width of the magnetosensitive portion to the second end surface as viewed in the plan view. Further, a value u derived from Expression (1) below is 0.6 or more:

$$u = \frac{\tan^{-1}\left(\frac{W+Wc}{2h}\right) - \tan^{-1}\left(\frac{W-Wc}{2h}\right)}{2\tan^{-1}\left(\frac{Wc}{2h}\right)} \quad (1)$$

where W is the width of the magnetosensitive portion, Wc/2 is the distance from the center position of the width of the magnetosensitive portion to the first end surface as viewed in the plan view, and h is a distance from a center position of the depth of the magnetosensitive portion to the excitation wiring.

According to the semiconductor device of the present invention, relevant arrangement of the excitation wiring which generates the calibration magnetic field and the magnetosensitive portion enhances the generation efficiency of the calibration magnetic field applied to the magnetosensitive portion, and also suppresses the intensity variation and the fluctuation of characteristics of each peripheral circuit caused by heat.

DETAILED DESCRIPTION OF THE PREFERRED EMBODIMENTS

Now, embodiments of the present invention are described in detail below with reference to the accompanying drawings.

In some of the drawings referred to in the following description, characteristic portions are enlarged for convenience and easy understanding thereof, and each component is not necessarily drawn to scale. Further, left, right, upper, and lower directions, or other directions used in the following description are defined based on the illustration.

First Embodiment

Figure 1:
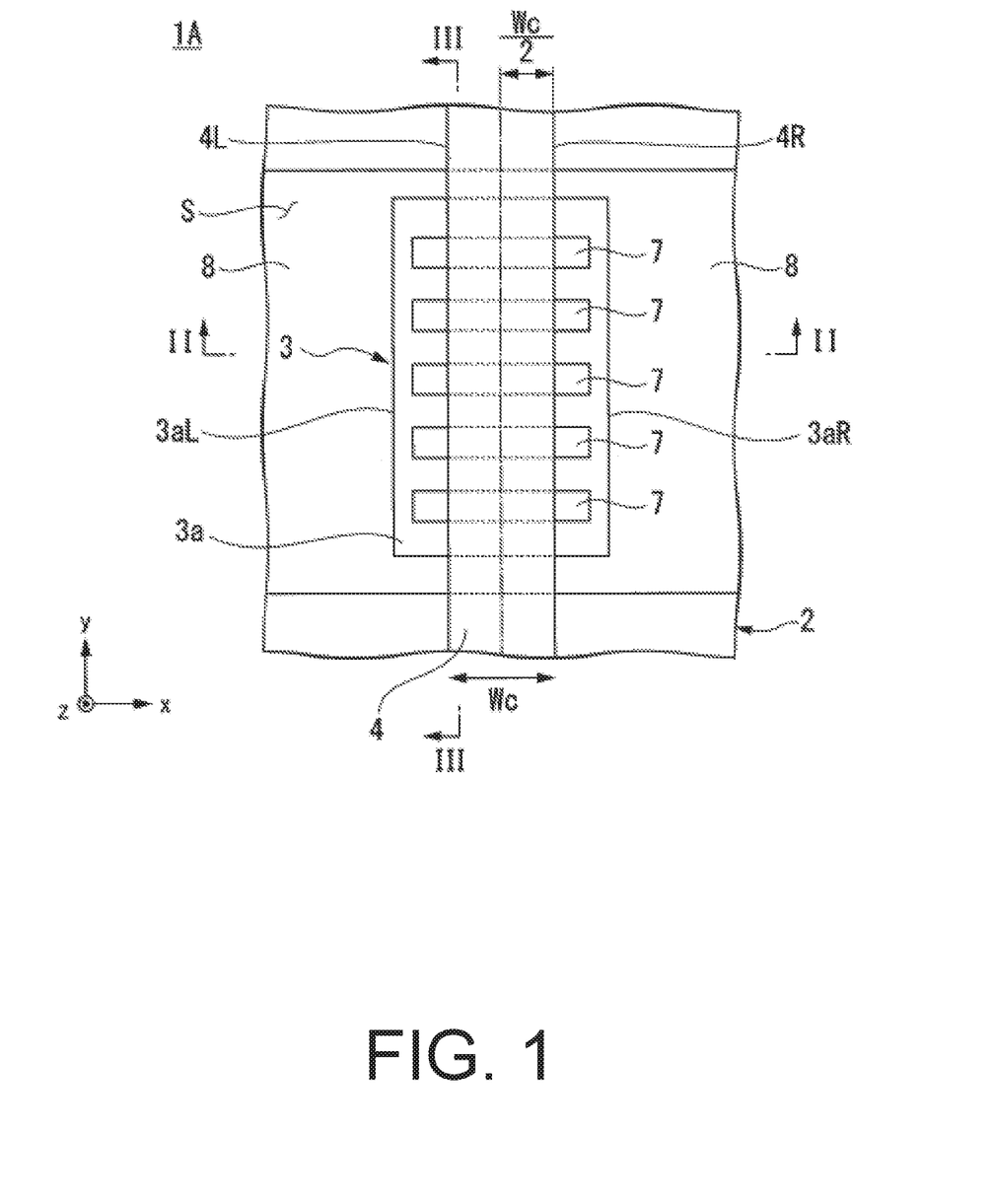
FIG. 1 is a plan view for illustrating a configuration of a semiconductor device according to the first embodiment of the present invention.
Figure 2:
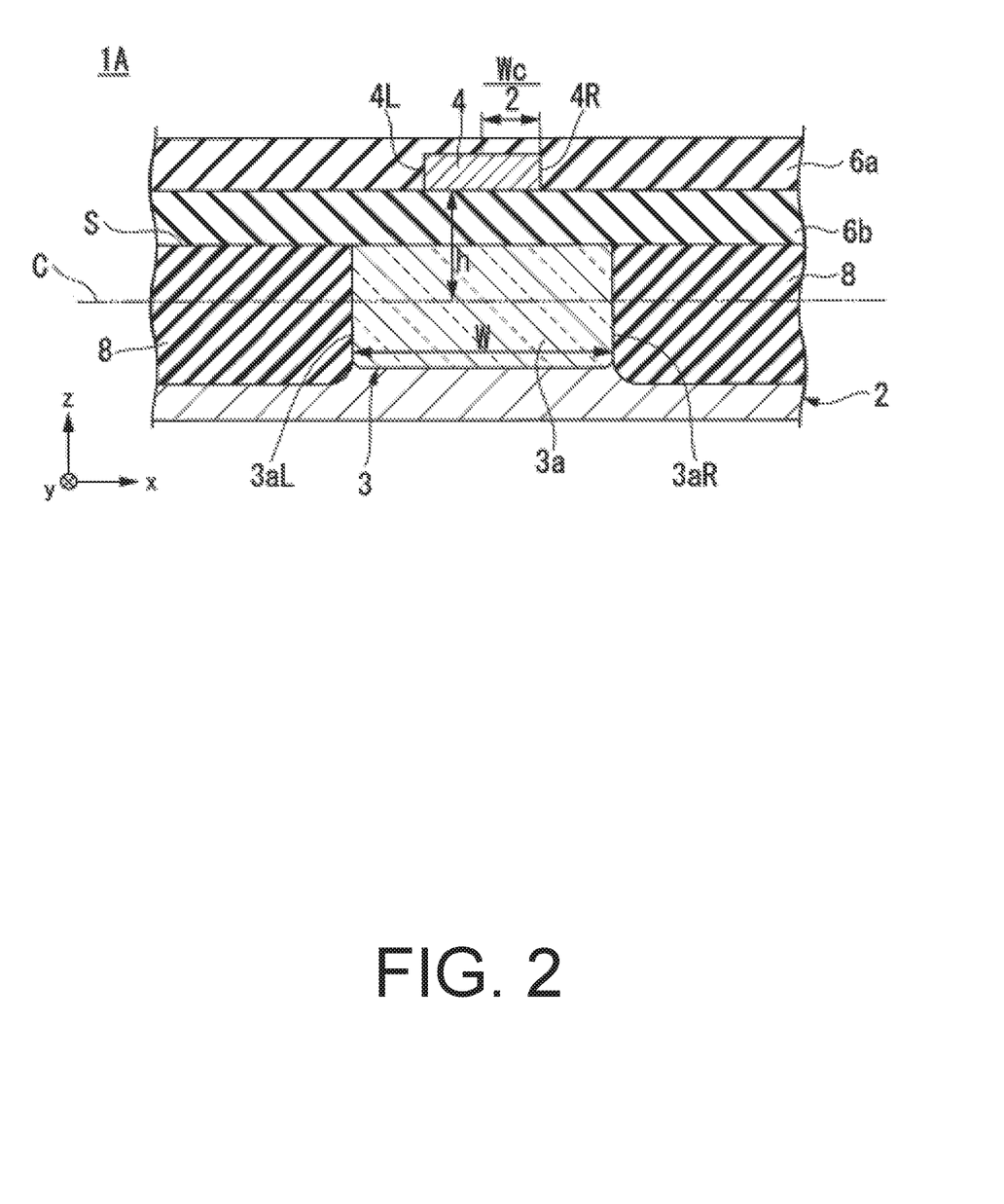
FIG. 2 is a sectional view taken along the line II-II of the semiconductor device according to the first embodiment.
Figure 3:
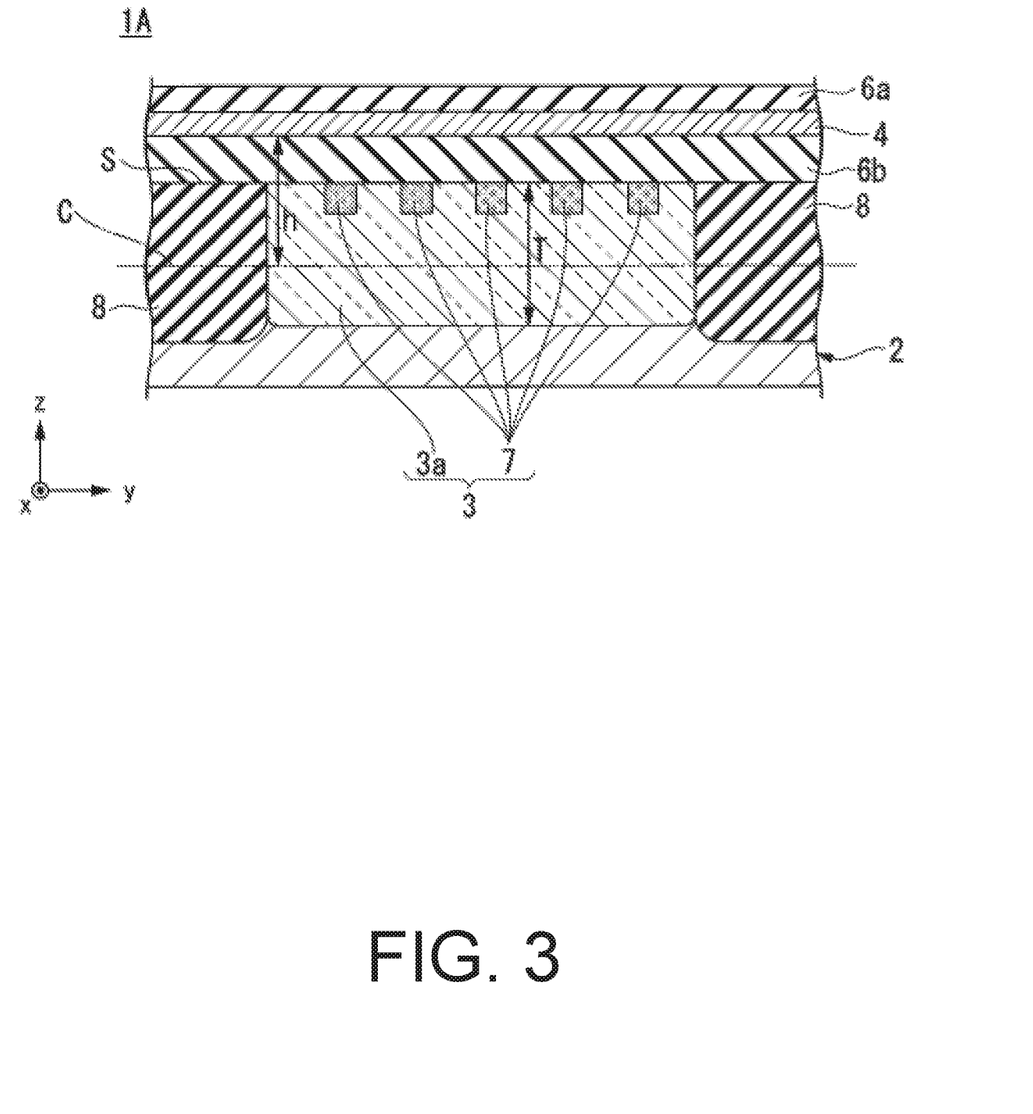
FIG. 3 is a sectional view taken along the line III-III of a main part of the semiconductor device according to the first embodiment.

FIG. 1 is a plan view for illustrating a configuration of a semiconductor device 1A according to the first embodiment of the present invention. FIG. 2 is a sectional view of the semiconductor device 1A taken along the line II-II of FIG. 1 (II-II sectional view). FIG. 3 is a sectional view of a main part of the semiconductor device 1A taken along the line III-III of FIG. 1 (III-III sectional view of the main part). In FIG. 1, insulating layers 6a and 6b which appear in FIGS. 2 and 3 are omitted for ease of description.

As illustrated in FIG. 1, FIG. 2, and FIG. 3, the semiconductor device 1A includes a semiconductor substrate 2, a vertical Hall element 3 which includes a magnetosensitive portion 3a and is formed in the semiconductor substrate 2, and an excitation wiring 4 provided above the magnetosensitive portion 3a.

The semiconductor substrate 2 has the first conductivity type (for example, P type) which is one of a P type and an N type. Further, the semiconductor substrate 2 has a surface S perpendicular to a depth direction as the first direction. The depth direction which is also the first direction is the z direction of a three-dimensional xyz orthogonal coordinate system. The semiconductor substrate 2 includes the vertical Hall element 3 and a diffusion layer 8.

The vertical Hall element 3 has the magnetosensitive portion 3a which detects a magnetic field component parallel to an element surface, and a plurality of (in the first embodiment, five) electrodes 7 provided above the magnetosensitive portion 3a. The electrodes 7 have a predetermined size (width) in a width direction as the second direction and are arranged side by side in a length direction as the third direction. The width direction which is also the second direction is perpendicular to the depth direction and is the x direction. Further, the length direction which is also the third direction is perpendicular to both of the depth direction and the width direction and is the y direction.

The magnetosensitive portion 3a is, for example, a semiconductor layer (well) formed by implanting impurities of the second conductivity type (for example, N type) which is the other one of the P type and the N type into the semiconductor substrate 2 of the first conductivity type. The magnetosensitive portion 3a is formed three-dimensionally with predetermined length, width, and depth. The magnetosensitive portion 3a has an end surface 3aR and an end surface 3aL which are opposite to each other in the width direction. A distance between the end surface 3aR and the end surface 3aL corresponds to a width W of the magnetosensitive portion 3a. A line connecting midpoints, that is, center positions in the width direction of the two end surfaces 3aR and 3aL corresponds to a center line in the width direction of the magnetosensitive portion 3a. The center line in the width direction of the magnetosensitive portion 3a extends in the length direction.

The magnetosensitive portion 3a illustrated in FIG. 1 to FIG. 3 is formed with the width W (W>0), a depth T (T>0) from the surface S, and a length larger than the width W. The depth T is set smaller than a thickness of the semiconductor substrate 2 in the depth direction.

Further, the magnetosensitive portion 3a has a function of detecting a magnetic field component in the width direction. With the magnetic field component in the width direction applied to the magnetosensitive portion 3a, a Hall voltage corresponding to the magnetic field component is generated between the electrodes 7 of the vertical Hall element 3.

The vertical Hall element 3 is electrically isolated from other regions of the semiconductor substrate 2 by the diffusion layer 8 surrounding the magnetosensitive portion 3a. The semiconductor substrate 2 includes, in the other regions, a circuit for processing an output signal from the vertical Hall element 3, a circuit for supplying current to the vertical Hall element 3, a circuit for compensating the characteristic of the vertical Hall element 3 with a calibration magnetic field, and the like as peripheral circuits.

On the surface S of the semiconductor substrate 2, the insulating layers 6a and 6b are laminated. The insulating layer 6b is formed to cover the surface S of the semiconductor substrate 2. The excitation wiring 4 is provided on the insulating layer 6b. The excitation wiring 4 is electrically isolated from the vertical Hall element 3 by the insulating layer 6b. The insulating layer 6a is formed on the insulating layer 6b to cover the excitation wiring 4.

The excitation wiring 4 is provided on the same side of the surface S of the semiconductor substrate 2, and apart from the magnetosensitive portion 3a. The excitation wiring 4 has an end surface 4R as the first end surface and an end surface 4L as the second end surface in the width direction and extends in the length direction. A distance between the end surface 4R and the end surface 4L is a width of the excitation wiring 4. Further, a line connecting midpoints, that is, center positions in the width direction of the end surface 4R and the end surface 4L is a center line in the width direction of the excitation wiring 4. The center line in the width direction of the excitation wiring 4 extends in the length direction. Further, the excitation wiring 4 is connected to a power supply (not shown).

A positional relation between the excitation wiring 4 and the magnetosensitive portion 3a is described in detail. In the semiconductor device 1A, a position at which the excitation wiring 4 is disposed is determined to have a predetermined positional relation between the excitation wiring 4 and the magnetosensitive portion 3a. The excitation wiring 4 has, in the depth direction, a lower surface on the same side of the surface S of the semiconductor substrate 2. The excitation wiring 4 is disposed with a distance h from a position corresponding to the center position in the depth direction of the magnetosensitive portion 3a, that is, a position at a depth T/2 that is half the depth T of the magnetosensitive portion 3a to the lower surface thereof in the depth direction. The position of the depth T/2 of the magnetosensitive portion 3a is indicated by the two-dot chain line C in FIG. 2 and FIG. 3.

For simple description, the center position in the width direction of the magnetosensitive portion 3a is referred to as "widthwise center position of the magnetosensitive portion 3a". Further, of the distances from the widthwise center position of the magnetosensitive portion 3a to the two end surfaces opposite to each other in the width direction of the excitation wiring 4, a distance smaller than or equal to the other distance is referred to as "the first distance", and a distance larger than or equal to the other distance is referred to as "the second distance" as viewed in plan view from the depth direction. Further, the first distance defines the distance Wc/2.

In the semiconductor device 1A, a position at which the excitation wiring 4 is disposed is determined based on an indicator (hereinafter referred to as "uniformity") "u" expressed by Expression (1) below. More specifically, the excitation wiring 4 is disposed at a position that provides the uniformity "u" of 0.6 or more. The uniformity "u" is expressed by Expression (1) below with the distance Wc/2 corresponding to the first distance, the width W of the magnetosensitive portion 3a, and the distance h.

$$u = \frac{\tan^{-1}\left(\frac{W + Wc}{2h}\right) - \tan^{-1}\left(\frac{W - Wc}{2h}\right)}{2\tan^{-1}\left(\frac{Wc}{2h}\right)} \quad (1)$$

Further, the excitation wiring 4 is disposed at a position at which the first distance is equal to the second distance as viewed in plan view from the depth direction. This position of the excitation wiring 4 is a position at which the center line in the width direction of the excitation wiring 4 matches the center line in the width direction of the magnetosensitive portion 3a. In other words, the excitation wiring 4 is disposed symmetrically with respect to the center line in the width direction of the magnetosensitive portion 3a as viewed in plan view from the depth direction.

Figure 4A:
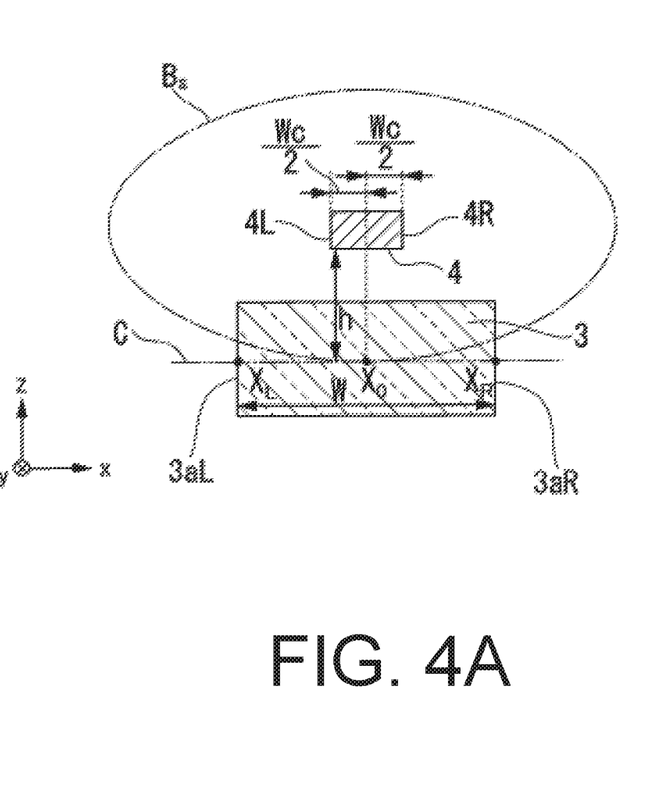
FIG. 4A and FIG. 4B are explanatory views for illustrating the principle of the semiconductor device according to the first embodiment.
Figure 4B:
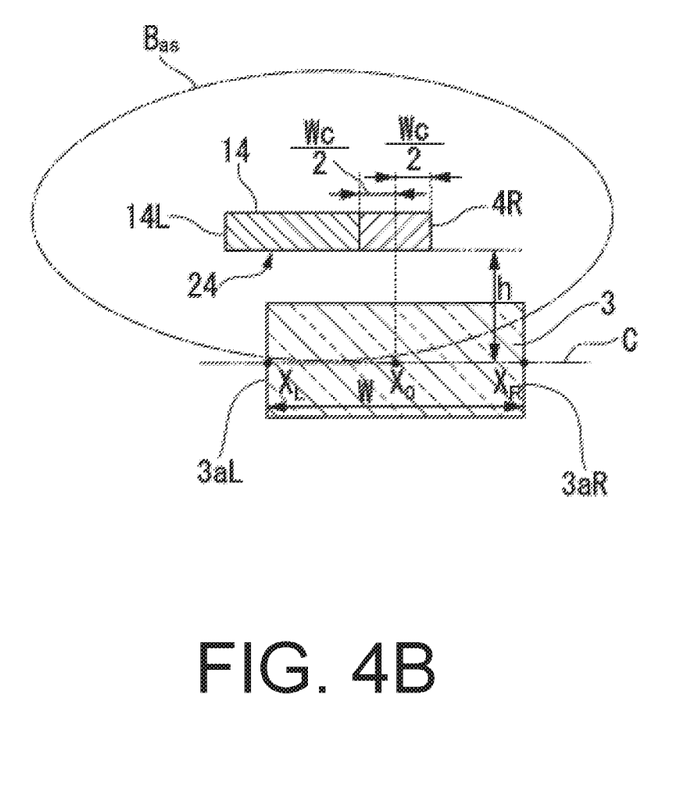

Next, with reference to FIGS. 4A and 4B, technical meaning of Expression (1) above is described.

FIG. 4A is an explanatory view for illustrating a positional relation between the magnetosensitive portion 3a and the excitation wiring 4 both of which are extracted from the configuration of FIG. 2. The two-dot chain line C of FIG. 4A indicates the position at the depth T/2 of the magnetosensitive portion 3a, and crosses the center line in the width direction of the magnetosensitive portion 3a, the end surface 3aR, and the end surface 3aL at points $X_0$, $X_R$, and $X_L$, respectively.

Prior to the description of the technical meaning of Expression (1) above, a coordinate xs is set. The coordinate xs is set to have the origin at the point $X_0$ which is the crossing point between the two-dot chain line C and the center line in the width direction of the magnetosensitive portion 3a. Specifically, if xs=0, the coordinate xs matches the point $X_0$. A value of the coordinate xs increases as the distance from the point $X_0$ increases on the two-dot chain line C. The value of the coordinate xs indicates the distance of the point on the two-dot chain line C from the point $X_0$.

In the configuration of FIG. 4A, a magnetic field intensity Bs of a calibration magnetic field at the coordinate xs generated by the current having current density j flowing through the excitation wiring 4 is represented by Expression (2) below in which a is a coefficient.

$$Bs = \alpha \times j \times \left\{ \tan^{-1}\left[\frac{\left(\frac{Wc}{2}\right) + xs}{h}\right] - \tan^{-1}\left[\frac{\left(-\frac{Wc}{2}\right) + xs}{h}\right] \right\} \quad (2)$$

The uniformity in the width direction of the intensity of the calibration magnetic field applied to the magnetosensitive portion 3a can be evaluated through comparison of calibration magnetic field intensities at two points that provide the maximum intensity and the minimum intensity, on the two-dot chain line C within the magnetosensitive portion 3a. In the magnetosensitive portion 3a having the positional relation illustrated in FIG. 4A, the point $X_R$ and the point $X_L$ are symmetric with respect to the center position in the width direction of the excitation wiring 4. In the case where the calibration magnetic field generated by the excitation wiring 4 has the intensity Bs, an x-direction component thereof has the maximum value at the point $X_0$ corresponding to the center position in the width direction, and the minimum value at the two points: the point $X_R$ and the point $X_L$. Accordingly, through comparison of the calibration magnetic field intensity at the point $X_0$ with the calibration magnetic field intensity at the point $X_R$ or the point $X_L$, the uniformity in calibration magnetic field intensity in the width direction of the magnetosensitive portion 3a can be evaluated.

Next, a description is given of a case in which the x-direction component of the calibration magnetic field intensity has the minimum value at one point on the two-dot chain line C within the magnetosensitive portion 3a.

The case in which the x-direction component of the calibration magnetic field intensity has the minimum value at one point corresponds to a case in which the first distance is smaller than the second distance, that is, the first distance is not equal to the second distance. Such a configuration can be theoretically considered equivalent to a configuration in which an excitation wiring 14 similar to the excitation wiring 4 is added to the excitation wiring 4 in the width direction. In view of this, taking as an example the configuration in which the excitation wiring 14 is added to the excitation wiring 4 in the width direction, the case in which the x-direction component of the calibration magnetic field intensity has the minimum value at one point is described.

FIG. 4B is an explanatory view for illustrating a positional relation between the magnetosensitive portion 3a and an excitation wiring 24 (excitation wirings 4 and 14), simulating the case in which the x-direction component of the calibration magnetic field intensity has the minimum value at one point.

The excitation wiring 14 has a right end surface and a left end surface 14L which are opposite to each other in the width direction. The right end surface thereof is in contact with the left end surface of the excitation wiring 4. The sum of calibration magnetic fields generated by the excitation wiring 4 and the excitation wiring 14 is equal to a calibration magnetic field generated by one excitation wiring 24. Accordingly, in the case where current flows through the excitation wiring 14 with the same current density as that in the excitation wiring 4, the excitation wiring 4 and the excitation wiring 14 can be assumed as one excitation wiring 24.

Assuming the excitation wiring 4 and the excitation wiring 14 as one excitation wiring 24, the distance Wc/2 from the center position in the width direction of the magnetosensitive portion 3a to the end surface 4R is defined as the first distance for the excitation wiring 24, and a distance from the center position in the width direction of the magnetosensitive portion 3a to the end surface 14L is defined as the second distance for the excitation wiring 24. In this case, the first distance is smaller than the second distance. Thus, the center position in the width direction of the excitation wiring 24 does not match the center position in the width direction of the magnetosensitive portion 3a. That is, the point $X_R$ and the point $X_L$ are asymmetric with respect to the center position in the width direction of the excitation wiring 24. The intensity Bas of the calibration magnetic field generated by the excitation wiring 24 has a different intensity distribution than the intensity Bs of the calibration magnetic field generated by the excitation wiring 4.

As described above, the uniformity in the width direction of the intensity Bas of the calibration magnetic field applied to the magnetosensitive portion 3a can be evaluated through the comparison of the calibration magnetic field intensities at two points that provide the maximum intensity and the minimum intensity on the two-dot chain line C. In the magnetosensitive portion 3a having the positional relation illustrated in FIG. 4B, the intensity of the calibration magnetic field generated by the excitation wiring 14 affects the calibration magnetic field intensities at the points $X_R$ and $X_L$. The degree of effect on the calibration magnetic field intensities at the points $X_R$ and $X_L$ is relatively large at the point $X_L$ closer to the excitation wiring 14 and is relatively small at the point $X_R$ farther from the excitation wiring 14. Thus, the magnetic field intensity at the point $X_L$ is higher than that at the point $X_R$ and is closer to the calibration magnetic field intensity at the point $X_0$. That is, in the magnetosensitive portion 3a illustrated in FIG. 4B, the x-direction component of the calibration magnetic field intensity has the minimum value at the point $X_R$.

In a case where the end surface 14L is disposed in contact with the end surface 4R, the right and left sides are reversed from the above-mentioned arrangement in which the right end surface of the excitation wiring 14 is disposed in contact with the left end surface of the excitation wiring 4. That is, in this case, the x-direction component of the calibration magnetic field intensity has the minimum value at the point $X_L$.

Further, if the uniformity "u" expressed by Expression (1) above is 0.6 or more, the maximum value of the x-direction component intensity of the calibration magnetic field in the magnetosensitive portion 3a almost matches the calibration magnetic field intensity at the point $X_0$. On the other hand, the x-direction component intensity of the calibration magnetic field takes the minimum value at at least one of the points $X_R$ and $X_L$ in the case where the excitation wiring 14 is disposed in contact with the left end surface or the right end surface of the excitation wiring 4.

As described above, in the case where the first distance is equal to the second distance (as in the example of FIG. 4A), the x-direction component of the calibration magnetic field intensity in the magnetosensitive portion 3a has the minimum value at both the points $X_R$ and $X_L$. Further, in the case where the first distance is smaller than the second distance (as in the example of FIG. 4B), the x-direction component of the calibration magnetic field intensity in the magnetosensitive portion 3a has the minimum value at one of the points $X_R$ and $X_L$ that is closer to the end surface of the excitation wiring 4 which is not in contact with the excitation wiring 14, with respect to the center position in the width direction of the magnetosensitive portion 3a. In other words, this point is one of the points $X_R$ and $X_L$ that is closer to one of the two end surfaces in the width direction of the excitation wiring 24 that is closer to the widthwise center position of the magnetosensitive portion 3a.

Thus, as illustrated in FIG. 4B, in the case where the right end surface of the excitation wiring 14 is in contact with the left end surface of the excitation wiring 4, the x-direction component of the calibration magnetic field intensity in the magnetosensitive portion 3a has the minimum value at the point $X_R$. In contrast, in the case where the left end surface of the excitation wiring 14 is in contact with the right end surface of the excitation wiring 4, the x-direction component of the calibration magnetic field intensity in the magnetosensitive portion 3a has the minimum value at the point $X_L$.

It can be concluded from the above-mentioned consideration that the uniformity in the width direction of the calibration magnetic field intensity in the magnetosensitive portion 3a can be evaluated through the comparison of the calibration magnetic field intensity at the point $X_0$ of the magnetosensitive portion 3a with that at the point $X_R$ or the point $X_L$ that is apart by the first distance in the width direction from the widthwise center position of the magnetosensitive portion 3a both in the examples of FIG. 4A and FIG. 4B. When the uniformity "u" is 0.6 or more, the calibration magnetic field generated by the excitation wiring 14 has, in particular, a small effect on the calibration magnetic field intensity at the point $X_0$ and the point $X_L$ or $X_R$. In this case, the uniformity of the intensity Bas of the calibration magnetic field generated by the excitation wiring 24 can be approximated by the uniformity of the intensity Bs of the calibration magnetic field generated by the excitation wiring 4 alone.

By the current flows through each of the excitation wirings 4 and 24, a calibration magnetic field is generated around the excitation wirings 4 and 24. The calibration magnetic field is applied to the magnetosensitive portion 3a. The calibration magnetic field intensity is proportional to the density of current flowing through the excitation wirings 4 and 24. Further, the calibration magnetic field intensity is inversely proportional to the distance from each of the excitation wirings 4 and 24. The calibration magnetic field intensities Bs and Bas at the coordinate xs on the two-dot chain line C are expressed by Expression (2) above. The sensor sensitivity of the vertical Hall element 3 is estimated based on a result of calculating the calibration magnetic field intensity Bs or Bas expressed by Expression (2).

It is preferred that the excitation wirings 4 and 24 extend along the length direction parallel to the y direction. With this configuration, the intensities Bs and Bas of the calibration magnetic fields respectively applied by the excitation wirings 4 and 24 to the magnetosensitive portion 3a become uniform in the length direction of the magnetosensitive portion 3a.

The uniformity "u" expressed by Expression (1) above corresponds to a value obtained by dividing the calibration magnetic field intensity at the end surface 3aR by the calibration magnetic field intensity at the center position in the width direction of the magnetosensitive portion 3a, that is, the point $X_0$. The uniformity "u" takes values in a range of $0 < u \leq 1$. When the value becomes closer to 1, uniformity of the intensity of the calibration magnetic field applied to the magnetosensitive portion 3a becomes higher, while when the value becomes closer to 0, uniformity of the intensity of the calibration magnetic field applied to the magnetosensitive portion 3a becomes lower.

As described above, at least a part of the excitation wiring 4 is required to overlap the widthwise center position of the magnetosensitive portion 3a as viewed in plan view from the depth direction. However, it is preferred to dispose the excitation wiring 4 so as to cover the magnetosensitive portion 3a rather than to overlap a part of the magnetosensitive portion 3a. Further, a suitable range for the relation between the distance Wc/2 and the width W of the magnetosensitive portion 3a varies depending on the relation between the width W of the magnetosensitive portion 3a and the distance h.

For example, when h/w=0.3, Wc/W is preferably 1 or more, and more preferably 1.4 or more. Further, when h/w=0.5, Wc/W is preferably 0.7 or more, and more preferably 1.4 or more. When h/w=0.1, Wc/W is preferably 1.05 or more, and more preferably 1.2 or more. The abovementioned suitable range can be achieved by setting the uniformity "u" to 0.6 or more.

Figure 5:
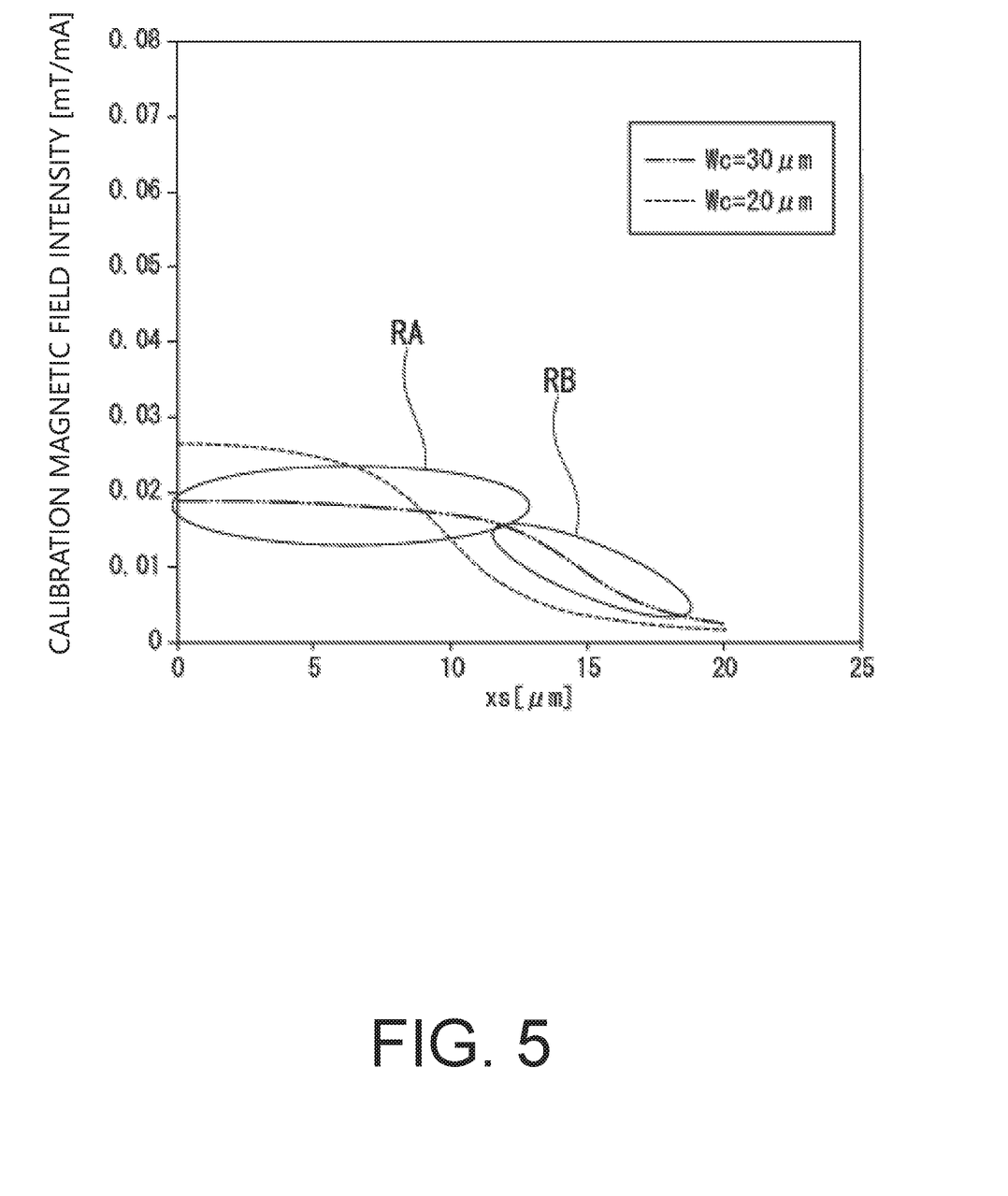
FIG. 5 is a graph for showing intensity distribution of a calibration magnetic field applied to a magnetosensitive portion along the two-dot chain line C.

FIG. 5 is a graph for showing a result of a simulation for a distribution of the calibration magnetic field intensity along the two-dot chain line C in the magnetosensitive portion 3a with the distance Wc/2 as a variable in the semiconductor device 1A. The horizontal axis is the coordinate xs, and the vertical axis is the calibration magnetic field intensity.

The calibration magnetic field intensity at the distance h from the lower surface of the excitation wiring 4 being set to 2 μm is shown for two cases in which the distance Wc is set to 20 μm and 30 μm. In the semiconductor device 1A, since the first distance is equal to the second distance, the distance Wc corresponds to the width of the excitation wiring 4.

The magnetic field intensity distribution includes a region RA having a gentle gradient observed near the point $X_0$, and a region RB having a steeper gradient than the region RA. In the graph of FIG. 5, the region RA and the region RB are shown for the case where the distance Wc corresponding to the width of the excitation wiring 4 is 30 μm.

In FIG. 5, the magnetic field intensity distribution with the distance Wc being set to 20 μm and 30 μm, and at the distance h being set to 2.2 tam is shown by way of example. In this example, the region RA and the region RB are included in each magnetic field intensity distribution. Further, it was confirmed that even if the distance Wc and distance h are different from the illustrated ones, the region RA and the region RB exist, although the size and the gradient are different, at any distance Wc and any distance h. It may be concluded that the uniformity "u" can be made high by setting the width W of the magnetosensitive portion 3a to fall within the region RA.

For example, when Wc=30 μm and h=2.2 μm, it is presumed from FIG. 5 that the uniformity "u" is high if the width W of the magnetosensitive portion 3a is smaller than 20 μm (twice larger than 10 μm as a range of the region RA in FIG. 5).

This means that the uniformity "u" in the magnetosensitive portion 3a is increased by selecting the distance Wc, the width W, and the distance h such that the magnetosensitive portion 3a is included in the region RA.

Through arranging the magnetosensitive portion 3a and the excitation wiring 4 so as to obtain the uniformity "u" of 0.6 or more, the magnetosensitive portion 3a is mainly applied with the calibration magnetic field in the region RA, and an effect of the calibration magnetic field in the region RB can be satisfactorily reduced. The semiconductor device 1A including the magnetosensitive portion 3a and excitation wiring 4 both arranged in this way can reduce variation in calibration magnetic field to be applied to the magnetosensitive portion 3a. The reason therefor is described below.

When the uniformity "u" is small, the end surfaces 3aR and 3aL in the width direction of the magnetosensitive portion 3a are included in the region RB. When the end surfaces 3aR and 3aL are included in the region RB, the intensity of the calibration magnetic field applied to each of the end surfaces 3aR and 3aL largely varies along with variation in width W of the magnetosensitive portion 3a caused by a manufacturing process, for example. As a result, a total calibration magnetic field applied to the magnetosensitive portion 3a rapidly changes.

Figure 6:
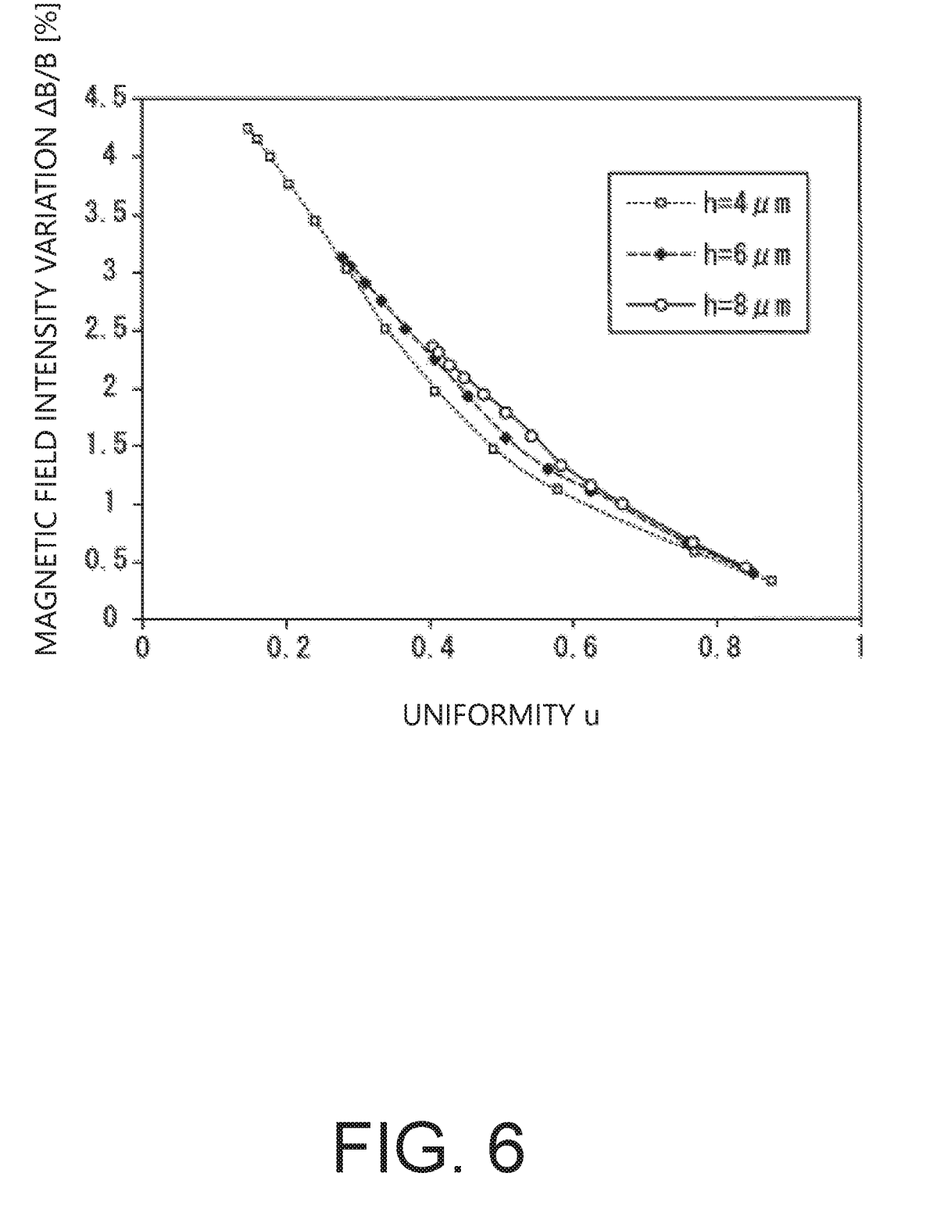
FIG. 6 is a graph for showing a relation between uniformity and intensity variation of the calibration magnetic field applied to the magnetosensitive portion.

FIG. 6 is a graph for showing a simulation result of rate of variation of the magnetic field intensity AB/B against variation of the uniformity "u". In more detail, ΔB/B indicates a rate of variation of the magnetic field intensity B (hereinafter referred to as "magnetic field intensity variation") obtained with varying uniformity "u" of the calibration magnetic field intensity, where AB is a variation amount of the magnetic field intensity B when the width W of the magnetosensitive portion 3a varies in a range of 5% or less in the semiconductor device 1A.

The horizontal axis is the uniformity "u", and the vertical axis is the magnetic field intensity variation ΔB/B. The uniformity "u" is varied by adjusting (Wc/2) in Expression (1) above with the distance h being fixed at 4 μm, 6 μm, and 8 μm. The magnetic field intensity B, on which the magnetic field intensity variation ΔB/B is based, is set to an average value of magnetic field intensities at the end surface 3aR and the end surface 3aL in the case of the width W of the magnetosensitive portion 3a being 20 μm. The magnetic field intensity variation ΔB/B is obtained as a result of simulating the variation by ±5% or less with respect to the width W of 20 μm, that is, the variation in a range of 19 μm≤W≤21 μm based on the average value as a reference. The variation in width W of the magnetosensitive portion 3a is determined based on, for example, the diffusion step after impurity implantation, a width of the depletion layer at the junction with a diffusion layer, and a test temperature.

When the distance h is 8 m, the magnetic field intensity variation ΔB/B in FIG. 6 rapidly increases in the range of the uniformity "u" of less than 0.6 μm. When the distance h is 6 μm and 4 μm as well, the same tendency as with the distance h of 8 μm is seen. When the distance h is 6 μm, the magnetic field intensity variation ΔB/B rapidly increases in the range of the uniformity "u" of less than 0.55. If the distance h is 4 μm, the magnetic field intensity variation ΔB/B rapidly increases in the range of the uniformity "u" of less than 0.5.

To describe the range of the uniformity "u" that causes such rapid increase in magnetic field intensity variation ΔB/B in association with the graph of FIG. 5, the range corresponds to the case in which one end of the magnetosensitive portion 3a is included in the region RB. Accordingly, in order to suppress such a rapid increase in magnetic field intensity variation ΔB/B, it suffices to form the semiconductor device 1A so that only the calibration magnetic field in the region RA is applied to the magnetosensitive portion 3a. That is, it suffices to form the semiconductor device 1A to obtain the uniformity "u" of 0.6 or more.

In this way, the semiconductor device 1A can have a configuration in which only the calibration magnetic field in the region RA can be applied by setting the uniformity "u" to 0.6 or more.

With the above-mentioned configuration, the semiconductor device according to the first embodiment can suppress variation in the intensity of the calibration magnetic field applied to the magnetosensitive portion 3a. Further, according to the semiconductor device of the first embodiment, since the widthwise distance between the excitation wiring 4 and the magnetosensitive portion 3a can be shortened, a magnetic field generation efficiency is high. Further, according to the semiconductor device of the first embodiment, since the excitation wiring 4 can be disposed close to the widthwise center position of the magnetosensitive portion 3a and thus disposed away from peripheral circuits, the thermal effect of heat generation in the excitation wiring 4 on the peripheral circuits can be suppressed. Thus, the semiconductor device according to the first embodiment can suppress fluctuation of characteristics of each peripheral circuit caused by heat, for example, asymmetric temperature distribution in each peripheral circuit. Consequently, according to the semiconductor device of the first embodiment, the sensor sensitivity of the vertical Hall element 3 can be estimated with high accuracy.

Second Embodiment

Figure 7:
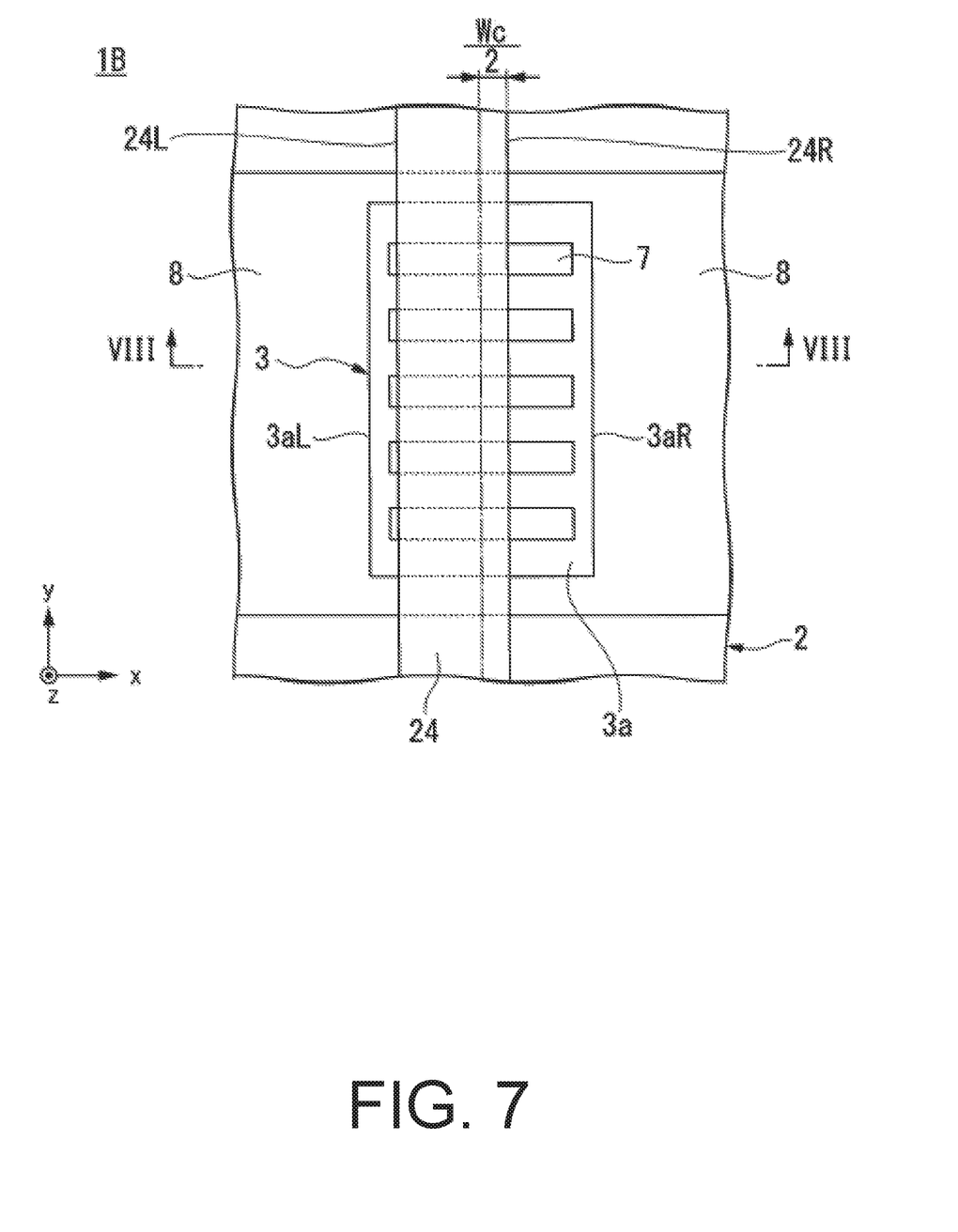
FIG. 7 is a plan view for illustrating a configuration of a semiconductor device according to the second embodiment of the present invention.
Figure 8:
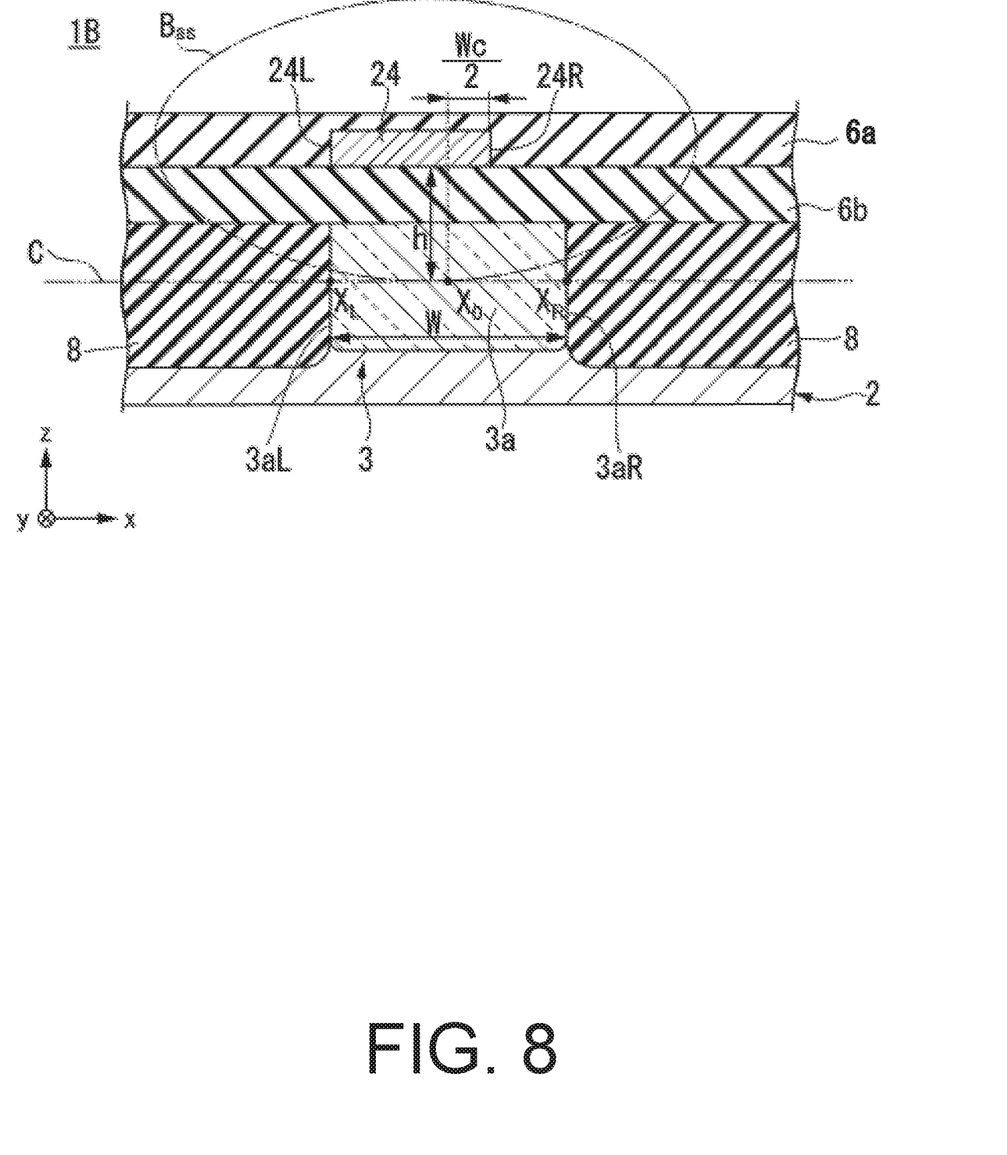
FIG. 8 is a sectional view taken along the line VIII-VIII of the semiconductor device according to the second embodiment.

FIG. 7 is a plan view for illustrating a configuration of a semiconductor device 1B according to the second embodiment of the present invention. FIG. 8 is a sectional view of the semiconductor device 1B taken along the line VIII-VIII of FIG. 7 (VIII-VIII sectional view). In FIG. 7, insulating layers 6a and 6b are omitted for ease of description.

The semiconductor device 1B differs from the semiconductor device 1A because the excitation wiring 24 is provided in place of the excitation wiring 4, but other configurations are not substantially different therefrom. In the following description, equivalent components to those of the semiconductor device 1A are denoted by identical reference symbols, and duplicate descriptions thereof are omitted.

Similar to the excitation wiring 4, the excitation wiring 24 has an end surface 24R as the first end surface and an end surface 24L as the second end surface in a width direction and extends along a length direction. The excitation wiring 24 is disposed at a position at which a distance from the widthwise center position of the magnetosensitive portion 3a to the end surface 24R is a distance Wc/2. Further, the excitation wiring 24 is disposed at a position at which the distance from the widthwise center position of the magnetosensitive portion 3a to the end surface 24R is smaller than a distance from the widthwise center position of the magnetosensitive portion 3a to the end surface 24L. That is, in the semiconductor device 1B, the excitation wiring 24 is disposed such that the distance Wc/2 from the widthwise center position of the magnetosensitive portion 3a to the end surface 24R is the first distance, and the distance from the widthwise center position of the magnetosensitive portion 3a to the end surface 24L is the second distance.

In the above-mentioned arrangement, the point $X_0$ corresponding to the center position in the width direction of the magnetosensitive portion 3a overlaps at least a part of the excitation wiring 24 but does not match the center position in the width direction of the excitation wiring 24 as viewed in plan view. That is, in the semiconductor device 1B, the excitation wiring 24 is disposed asymmetrically with respect to the center line in the width direction of the magnetosensitive portion 3a as viewed in plan view.

The semiconductor device 1B is constituted so that the uniformity "u" expressed by Expression (1) above is 0.6 or more where the uniformity "u" is determined from the distance Wc/2 corresponding to the first distance of the excitation wiring 24, the width W of the magnetosensitive portion 3a, and the distance h from the center position in the depth direction of the magnetosensitive portion 3a to the lower surface of the excitation wiring 24. In the second embodiment, the uniformity "u" expressed by Expression (1) above is obtained by dividing an intensity of the calibration magnetic field applied to the point $X_R$ by an intensity of the calibration magnetic field applied to the point $X_0$ in which the point $X_R$ is located farther from the center position in the width direction of the excitation wiring 24 among the points $X_L$ and $X_R$ that are set on the end surfaces 3aL and 3aR, respectively, in the width direction of the magnetosensitive portion 3a, and that cross the two-dot chain line C.

Here, with reference to FIG. 4B, the excitation wiring 24 is assumed to include the excitation wiring 4 and the excitation wiring 14 as described above, and a portion corresponding to the excitation wiring 4 is referred to as "symmetric portion" and a portion corresponding to the excitation wiring 14 is referred to as "asymmetric portion" for simple description.

Since the semiconductor device 1B is constituted to have the uniformity "u" of 0.6 or more, as described above, the calibration magnetic field generated by current flowing through the asymmetric portion of the excitation wiring 24 has a small effect on the calibration magnetic field intensities at the point $X_O$ and the point $X_L$ or $X_R$. Thus, as for the uniformity of the intensity Bas of the calibration magnetic field generated by the excitation wiring 24 including the asymmetric portion in addition to the symmetric portion, the uniformity can be approximated by the uniformity of the intensity Bs of the calibration magnetic field generated by the excitation wiring 4 alone.

As described above, in the semiconductor device 1B, the calibration magnetic field in the region RA can be mainly applied to the magnetosensitive portion 3a with the uniformity "u" being set to 0.6 or more. With the configuration in which the uniformity "u" is 0.6 or more, it is possible to increase the uniformity of the intensity Bas of the calibration magnetic field applied to the magnetosensitive portion 3a.

According to the semiconductor device of the second embodiment, since the lateral distance between the excitation wiring 24 and the magnetosensitive portion 3a can be reduced, the magnetic field generation efficiency is high. Further, according to the semiconductor device of the second embodiment, the excitation wiring 24 can be disposed close to the widthwise center position of the magnetosensitive portion 3a, and thus disposed away from peripheral circuits. And the thermal effect of heat generation in the excitation wiring 24 on the peripheral circuits can be reduced. Thus, the semiconductor device according to the second embodiment can suppress fluctuation of characteristics of each peripheral circuit caused by heat, for example, asymmetric temperature distribution in each peripheral circuit. Consequently, according to the semiconductor device of the second embodiment, the sensor sensitivity of the vertical Hall element 3 can be estimated with high accuracy.

In the above, the preferred embodiments of the present invention are described in detail, but the present invention is not limited to the above-mentioned specific embodiments. For example, the above-mentioned materials and dimensions are given by way of example, and the present invention is not limited thereto.

In the above-mentioned embodiments, the description is given of the configurations of the semiconductor devices 1A and 1B in which the excitation wiring 4 or 24 is disposed in a part of a region immediately above the magnetosensitive portion 3a in the width direction with reference to the drawings, but the semiconductor devices 1A and 1B are not limited to the illustrated examples. In the semiconductor device 1A, the excitation wiring 4 is only required to overlap at least a part of the width of the magnetosensitive portion 3a as viewed in plan view from the depth direction, and thus may overlap the entire magnetosensitive portion 3a. Further, in the semiconductor device 1B, the excitation wiring 24 is only required to overlap at least a part of the width of the magnetosensitive portion 3a as viewed in plan view from the depth direction, and thus may overlap the entire magnetosensitive portion 3a.

From the viewpoint of increasing the uniformity "u", the semiconductor device 1A and 1B respectively constituted to have the excitation wirings 4 and 24 overlapping the entire width of the magnetosensitive portion 3a are more preferred than the semiconductor devices 1A and 1B respectively constituted to have the excitation wirings 4 and 24 overlapping a part of the width of the magnetosensitive portion 3a as viewed in the plan view.

Further, in the embodiments described above, the description is given of the excitation wiring 4 formed linearly. However, the excitation wiring 4 is not necessarily required to be formed linearly throughout the entire portion in the length direction. The excitation wiring 4 is only required to be formed linearly in at least a portion overlapping the magnetosensitive portion 3a as viewed in plan view from the surface S. Then, other portions thereof are not necessarily required to be formed linearly.

In the embodiments described above, the description is given of the case in which the first distance is equal to the second distance (FIG. 4A) and the case in which the first distance is smaller than the second distance (FIG. 4B), that is, the case in which the first distance is equal to or smaller than the second distance (FIG. 4A and FIG. 4B). Further, the description is given of the semiconductor device 1B including the excitation wiring 24 disposed at the position at which the distance from the widthwise center position of the magnetosensitive portion 3a to the end surface 24R is smaller than the distance from the widthwise center position of the magnetosensitive portion 3a to the end surface 24L, as an example of the case in which the first distance is smaller than the second distance. However, the present invention is not limited to this example. In the semiconductor device 1B, the excitation wiring 24 may be disposed such that the distance from the widthwise center position of the magnetosensitive portion 3a to the end surface 24L is smaller than the distance from the widthwise center position of the magnetosensitive portion 3a to the end surface 24R.

In the case where the excitation wiring 24 is disposed such that the distance from the widthwise center position of the magnetosensitive portion 3a to the end surface 24L is smaller than the distance from the widthwise center position of the magnetosensitive portion 3a to the end surface 24R, the distance from the widthwise center position of the magnetosensitive portion 3a to the end surface 24L is the first distance, and the distance to the end surface 24R therefrom is the second distance as viewed in plan view from the depth direction. Further, the distance Wc/2 corresponds to the distance from the widthwise center position of the magnetosensitive portion 3a to the end surface 24L.

The above-mentioned embodiments may be implemented in other various modes, and various kinds of omissions, replacements, and modifications can be made without departing from the gist of the invention. Those embodiments and variations thereof are included in the scopes of the invention described in the appended claims and their equivalents in the same way as those are included in the scope and gist of the invention.

What is claimed is:

1. A semiconductor device comprising:
a semiconductor substrate having a surface perpendicular to a first direction;
a vertical Hall element formed in the semiconductor substrate, and including a magneto sensitive portion having a depth in the first direction, a width in a second direction perpendicular to the first direction, and a length in a third direction perpendicular to both of the first direction and the second direction; and
an excitation wiring having a first end surface and a second end surface in the second direction, and extending in the third direction,
wherein the excitation wiring is disposed on a surface side of the semiconductor substrate and at a position that is apart from the magnetosensitive portion, and overlaps a center position of the width of the magnetosensitive portion as viewed in plan view from the first direction,
wherein at the position at which the excitation wiring is disposed, a distance from the center position of the width of the magnetosensitive portion to the first end surface is equal to or smaller than a distance from the center position of the width of the magnetosensitive portion to the second end surface as viewed in the plan view, and wherein a value "u" derived from Expression (1) below is 0.6 or more:

$$u = \frac{\tan^{-1}\left(\frac{W+Wc}{2h}\right) - \tan^{-1}\left(\frac{W-Wc}{2h}\right)}{2\tan^{-1}\left(\frac{Wc}{2h}\right)} \quad (1)$$

where W is the width of the magnetosensitive portion, Wc/2 is the distance from the center position of the width of the magnetosensitive portion to the first end surface as viewed in the plan view, and h is a distance from a center position of the depth of the magnetosensitive portion to the excitation wiring.

2. The semiconductor device according to claim 1, wherein the excitation wiring covers the magnetosensitive portion as viewed in the plan view.

3. The semiconductor device according to claim 2, wherein the excitation wiring is disposed at a position at which a center position of the excitation wiring in the second direction overlaps a center position of the magneto sensitive portion in the second direction as viewed in the plan view.

4. The semiconductor device according to claim 1, wherein the excitation wiring is disposed at a position at which a center position of the excitation wiring in the second direction overlaps a center position of the magneto sensitive portion in the second direction as viewed in the plan view.

* * * * *

UNITED STATES PATENT AND TRADEMARK OFFICE
CERTIFICATE OF CORRECTION

PATENT NO. : 11,367,831 B2
APPLICATION NO. : 16/803016
DATED : June 21, 2022
INVENTOR(S) : Yohei Ogawa et al.

Page 1 of 1

It is certified that error appears in the above-identified patent and that said Letters Patent is hereby corrected as shown below:

In the Claims

Column 14, Claim 1, Line 51; Column 15, Claim 3, Line 25; and Column 15, Claim 4, Line 30:
Delete "magneto sensitive" and replace with --magnetosensitive--.

Signed and Sealed this
Twenty-fourth Day of September, 2024

Katherine Kelly Vidal
*Director of the United States Patent and Trademark Office*